(12) United States Patent
Yip

(10) Patent No.: US 7,379,365 B2
(45) Date of Patent: May 27, 2008

(54) METHOD AND APPARATUS FOR CHARGING LARGE CAPACITANCES

(75) Inventor: Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 124 days.

(21) Appl. No.: 11/492,765

(22) Filed: Jul. 26, 2006

(65) Prior Publication Data
US 2008/0025104 A1    Jan. 31, 2008

(51) Int. Cl.
*G11C 7/02* (2006.01)
(52) U.S. Cl. .................. 365/210; 365/189.07
(58) Field of Classification Search ........... 365/210, 365/189.07, 149
See application file for complete search history.

(56) References Cited

U.S. PATENT DOCUMENTS 6,424,585 B1 *   7/2002   Ooishi .................. 365/226

* cited by examiner

*Primary Examiner*—Son Dinh
(74) *Attorney, Agent, or Firm*—Dickstein Shapiro LLP

(57) ABSTRACT

A method and apparatus for charging large capacitances of a circuit, such as an integrated circuit, without imparting noise on an operating voltage. A comparator compares a reference voltage to a voltage representing the voltage on the capacitance and a multiplexer routes one of an external voltage or an operating voltage derived from said external voltage to charge the capacitance depending on the output of the comparator.

26 Claims, 4 Drawing Sheets

METHOD AND APPARATUS FOR CHARGING LARGE CAPACITANCES

FIELD OF THE INVENTION

The invention relates generally to a method and apparatus for charging large capacitances in a circuit and more specifically to a method and apparatus for charging large capacitances in an integrated circuit device, for example, a memory device.

BACKGROUND OF THE INVENTION

Many circuits including integrated circuit devices require the charging of large capacitances for operation. One such integrated circuit device is a flash memory device; a non-volatile memory which retains stored data when power is removed. A common type of flash memory architecture is the "NAND" architecture, so called for the resemblance which the basic memory cell configuration has to a basic NAND gate circuit.

A flash memory device can be erased and reprogrammed in blocks instead of one byte at a time. A typical flash memory device comprises a memory array, which includes a large number of memory cells and peripheral support circuits. Each of the memory cells includes a floating gate field-effect transistor capable of holding a charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

The operation of a flash memory requires charging and discharging the capacitances associated with the memory cells, bit lines, and other components within the device, which can be on the order of 50 nF. Charging these capacitances requires a large amount of current.

FIG. 1 illustrates a conventional circuit 10 for regulating current to charge the capacitance 104 within a NAND flash memory device. The capacitance 104 may be a capacitance associated with memory cells, bit lines and/or other components and lines within the flash memory device. An external power supply 100 supplies an external voltage $V_{ext}$ that is higher than the regulated voltage $V_{cc}$ required for the general operation of the NAND flash memory device and other circuits 106 present on the same integrated circuit (IC) chip. An operating voltage regulator 102 converts the external voltage $V_{ext}$ to the lower operating voltage $V_{cc}$, which is then supplied to the components of the flash memory array and the other circuits 106.

The operating voltage $V_{cc}$ is used to charge the capacitance 104. However, if the charging current $I_2$ is uncontrolled, the capacitance 104 of the NAND flash memory may charge too quickly, causing the operating voltage $V_{cc}$ to drop. This drop causes noise in the operating voltage $V_{cc}$, which adversely impacts the operation of the other circuits 106.

A technique for controlling the charging current $I_2$ is to use a current mirror circuit 108 to maintain the charging current $I_2$ equal to a reference current $I_{ref}$. The current mirror circuit 108 includes two transistors 120 and 122 whose gates are connected to each other and to the reference current $I_{ref}$.

The current mirror circuit 108 restricts the charging current $I_2$ to the known amount of the reference current $I_{ref}$ and thus reduces potential noise from impacting the operating voltage $V_{cc}$. However, because the capacitance 104 of the flash memory is charged using less current, the amount of time needed to charge the capacitance 104 is increased. Therefore, the reduction of noise in the operating voltage $V_{cc}$ is traded off for an increased time required to charge the capacitance 104.

A method and apparatus is therefore needed for charging a large capacitance of a circuit such as an integrated circuit device, e.g., a flash memory device, quickly without disrupting the operating voltage supplied to other circuits on the same integrated circuit chip.

BRIEF DESCRIPTION OF THE DRAWINGS

Features and advantages of the invention will be more readily understood from the following detailed description of the invention which is provided in connection with the accompanying drawings, in which.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
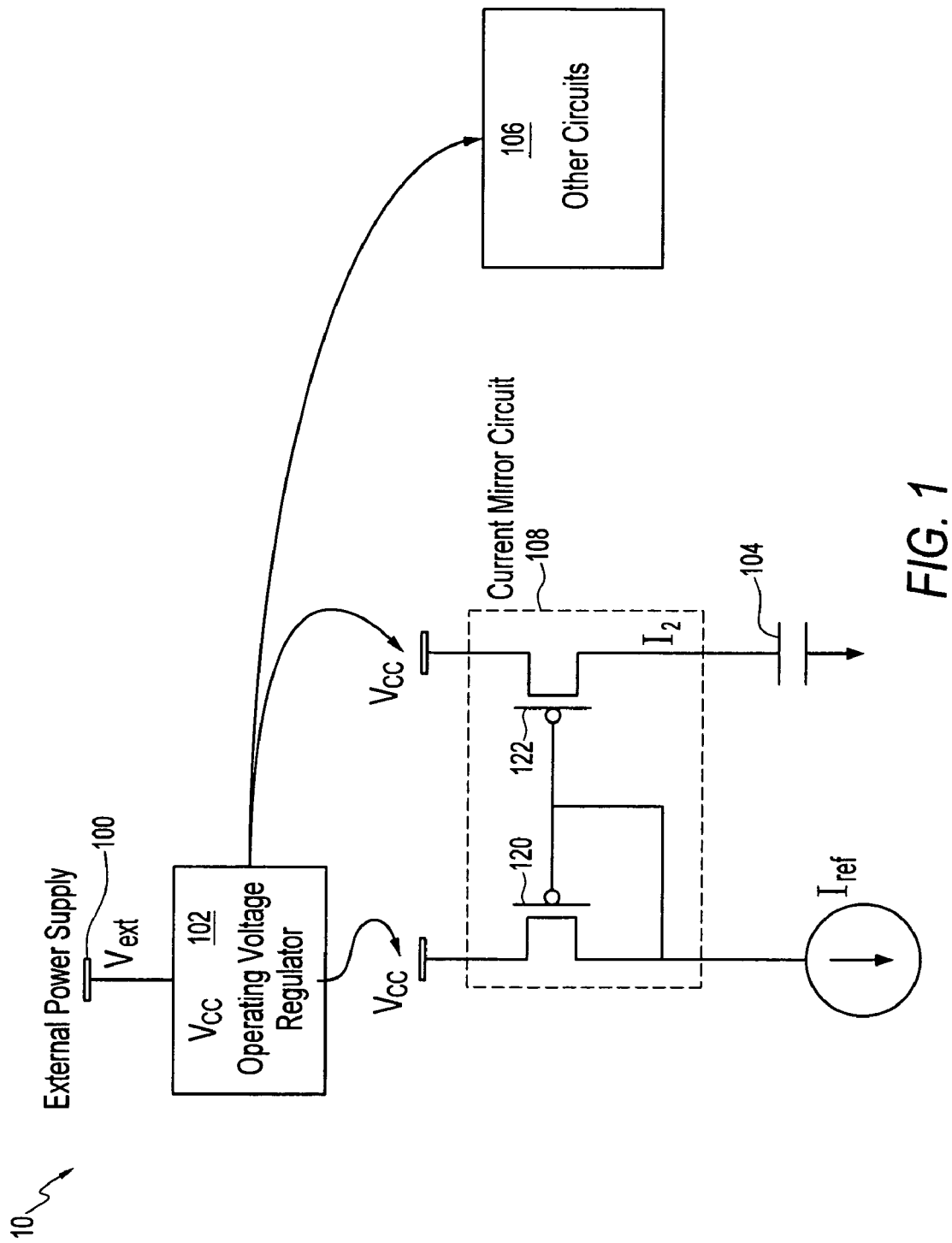
FIG. 1 illustrates a conventional circuit for charging a large capacitance in a circuit, such as an integrated circuit, which may be in a memory device.
Figure 2:
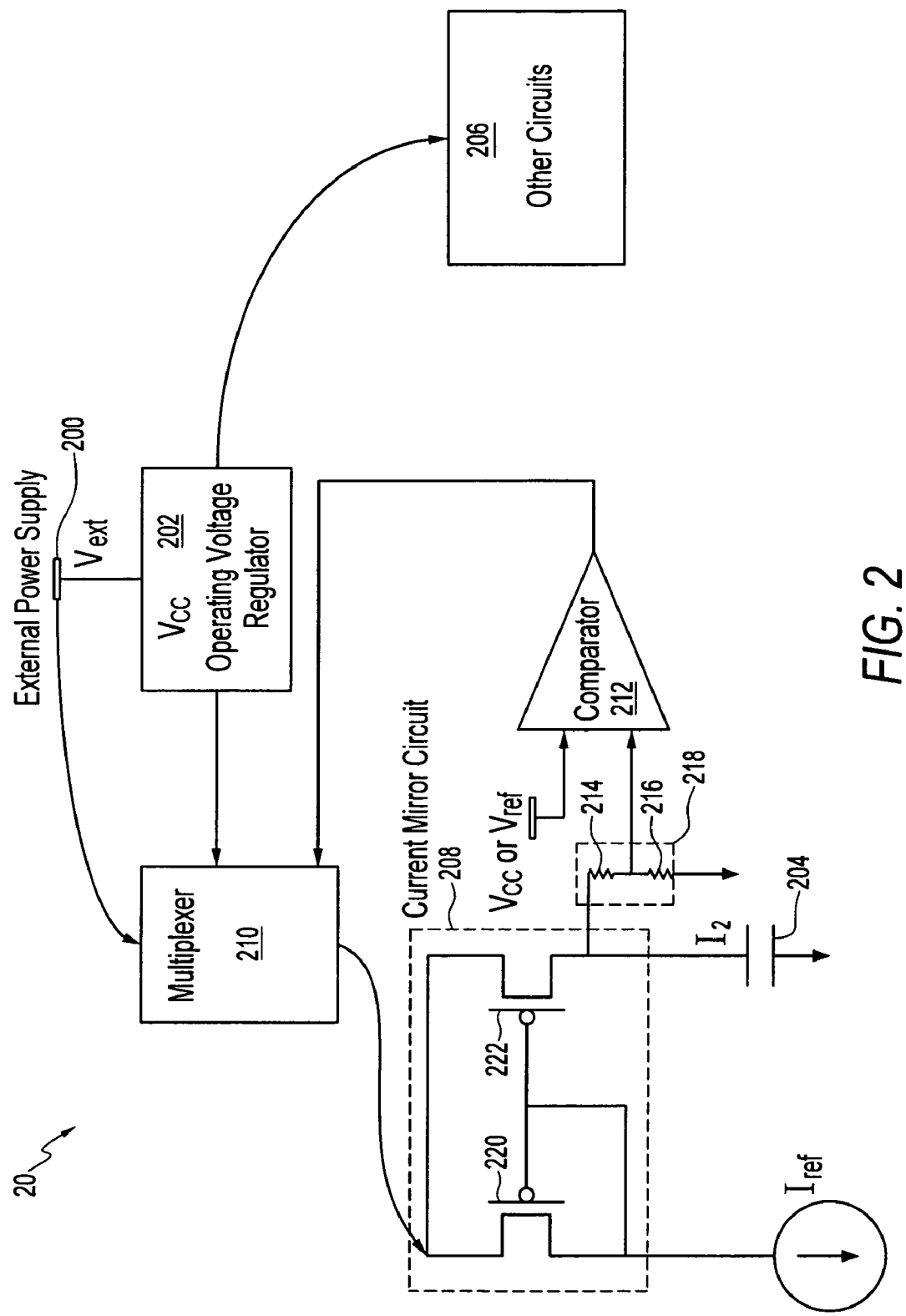
FIG. 2 illustrates a circuit for an integrated circuit device, for example, a flash memory device, for charging a large capacitance in accordance with an embodiment of the invention.

FIG. 2 illustrates a circuit 20, for limiting the current used to charge a large capacitance 204 of a circuit such as an integrated circuit device, e.g., a flash memory device, constructed in accordance with an embodiment of the invention. The circuit 20 includes an operating voltage regulator 202, a multiplexer 210, a current mirror circuit 208 including transistors 220 and 222, a comparator 212, and a voltage divider 218 including a first resistor 214 and a second resistor 216. The capacitance 204 may be a capacitance associated with various components and signal lines of an integrated circuit. For example, for a flash memory integrated circuit device, the capacitance 204 may be a capacitance associated with memory cells, bit lines and/or other components and lines within the flash memory.

An external power supply 200 supplies an external voltage $V_{ext}$ to the operating voltage regulator 202 and to the multiplexer 210. The operating voltage regulator 202 reduces the external voltage $V_{ext}$ to a lower regulated operating voltage $V_{cc}$. For example, the external voltage $V_{ext}$ may be 3.3 V and the operating voltage $V_{cc}$ may be 2.5 V. The operating voltage regulator 202 supplies the operating voltage $V_{cc}$ to the multiplexer 210 and to other circuits 206.

The multiplexer 210, under the control of an output from comparator 212, routes either the external voltage $V_{ext}$ or the operating voltage $V_{cc}$ to the current mirror circuit 208. The current mirror circuit 208 maintains the charging current $I_2$ at the same level as the reference current $I_{ref}$. The charging current $I_2$ is then used to charge the capacitance 204.

The voltage associated with the capacitance 204 and a reference voltage $V_{ref}$ are provided to respective inputs of the comparator 212. The voltage of the capacitance 204 is divided by the voltage divider 218 before it is sent to the comparator 212. Alternatively, the voltage divider 218 may be omitted and the voltage level of the capacitance 204 may be sent to the comparator 212 undivided. The reference voltage $V_{ref}$ may be the same as or different from the operating voltage $V_{cc}$ as is described below in more detail.

In operation, the comparator 212 compares the voltage level of the capacitance 204 against the reference voltage $V_{ref}$. If the voltage level of the capacitance 204 is lower than the reference voltage $V_{ref}$, the comparator 212 sends a first signal to the multiplexer 210. The value of the first signal may be logic low or high, provided that the multiplexer 210 is adjusted to react to the first signal by routing the external voltage $V_{ext}$ from the external power supply 200 to the current mirror circuit 208. The transistors 220 and 222 of the current mirror circuit 208 are able to handle the increased voltage for a limited amount of time and therefore the capacitance 204 may be charged more quickly using the higher external voltage $V_{ext}$ without impacting the operating voltage $V_{cc}$ sent to the other circuits 206.

When the voltage of the capacitance 204 becomes higher than the reference voltage $V_{ref}$, the comparator 212 sends a second signal to the multiplexer 210. The second signal will have a logic value opposite the value of the first signal. The multiplexer 210 reacts to the second signal by routing the operating voltage $V_{cc}$ from the operating voltage regulator 202 to the current mirror circuit 208. It should be appreciated that the multiplexer 210 may be any switching device or other logic capable of selecting between two inputs and providing the selected input as an output based on an input control signal or signals.

The value of $V_{ref}$ and/or the value of the resistances of the first resistor 214 and the second resistor 216 of the voltage divider 218 may be adjusted so that the capacitance 204 is charged to a voltage less than or slightly less than the operating voltage $V_{cc}$ using the external voltage $V_{ext}$ before the comparator 212 switches the voltage supply from the external power supply 200 to the operating voltage regulator 202 to finish charging the capacitance 204 using the operating voltage $V_{cc}$. Alternatively, the value of $V_{ref}$ and the value of the resistance of the voltage divider 218 may be adjusted so that the capacitance 204 is charged to the same voltage as the operating voltage $V_{cc}$ or to a voltage above the operating voltage $V_{cc}$ using the external voltage $V_{ext}$ before the comparator 212 switches the voltage supply from the external power supply 200 to the operating voltage regulator 202.

Using the circuit 20 of the invention, the capacitance 204 of a flash memory, such as a NAND flash memory, may be charged directly from the external power supply 200 rather than through the operating voltage regulator 202 when desired. Since the charging of the capacitance 204 is done by the external power supply 200 rather than the operating voltage regulator 202, the charging current $I_2$ can be independently adjusted to obtain the desired charging time (by increasing the reference current $I_{ref}$) without impacting the operating voltage $V_{cc}$. The capacitance 204 may therefore be charged quickly without creating excessive noise in the operating voltage $V_{cc}$ and disrupting the operation of the other circuits 206.

Figure 3:
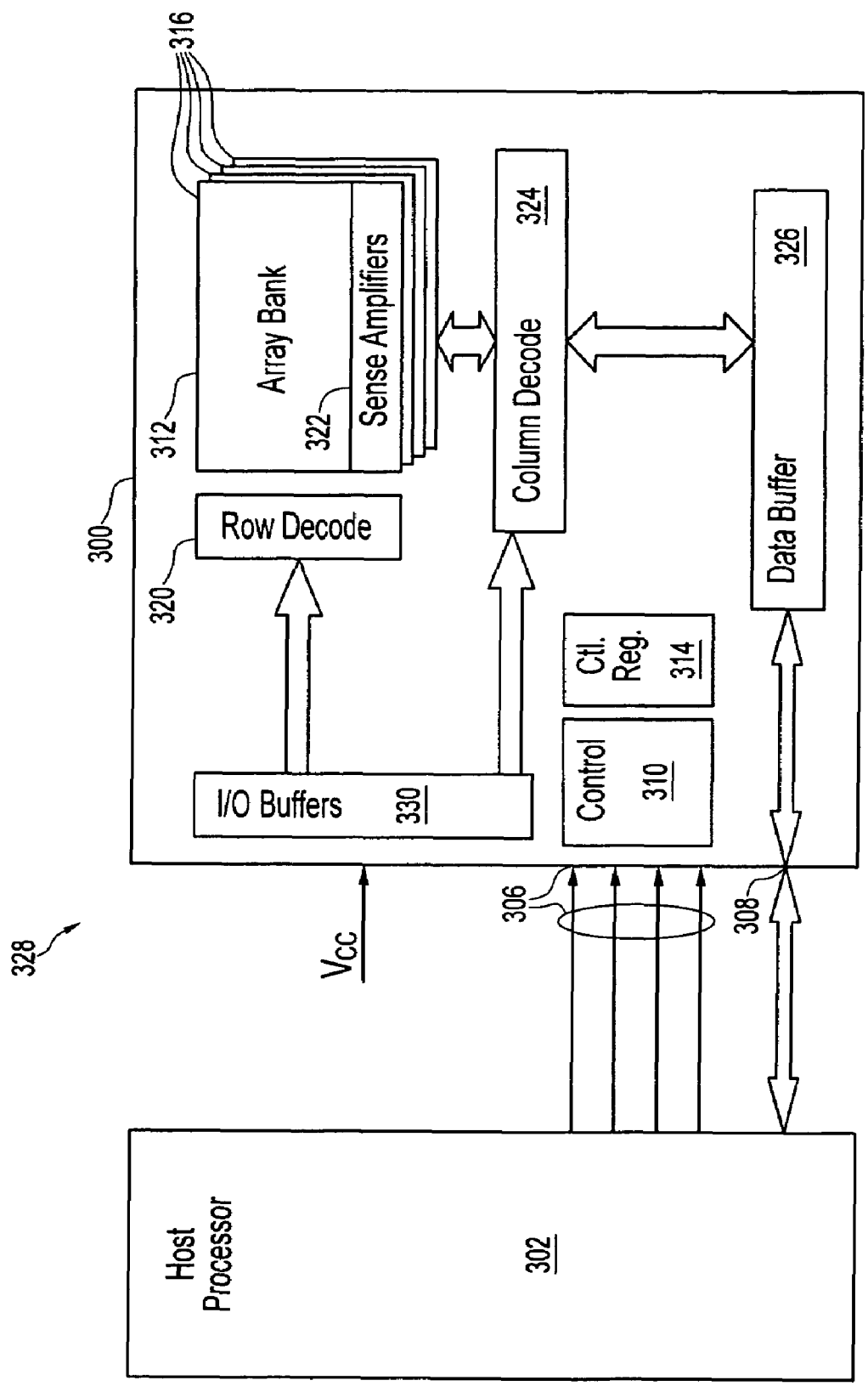
FIG. 3 illustrates a simplified block diagram of a system containing a flash memory device constructed in accordance with an embodiment of the invention.

FIG. 3 illustrates an exemplary system 328 incorporating a flash memory device 300 that may incorporate a circuit according to an embodiment of the invention. The operating voltage $V_{cc}$ is supplied to circuits of the disclosed flash memory. The flash memory device 300 is connected to a host 302, which is typically a processor, other processing device or memory controller. The flash memory device 300 is connected to a control bus 306 and an address/data bus 308 that are each connected to the host 302 to allow memory read and write accesses. It is noted that in alternative embodiments, the address/data bus 308 can be divided into separate buses. Internal to the flash memory device 300, a control state machine 310 directs internal operations; manages the flash memory array 312 and updates RAM control registers and non-volatile erase block management registers 314. The registers 314 (which may include tables) are utilized by the control state machine 310 during operation of the flash memory 300.

The flash memory array 312 contains a sequence of memory banks 316 or segments, each bank 316 being organized logically into a series of erase blocks. Memory access addresses are received on the address/data bus 308 and are divided into row and column address portions. On a read access the row address is latched and decoded by row decode circuit 320, which selects and activates a row page of memory cells and the other memory cells in their associated strings across a selected memory bank and communicates with I/O buffers 330. The bit values encoded in the output of the selected row of memory cells are connected to a global bit line and detected by sense amplifiers 322 associated with the memory bank. The column address for the access is latched and decoded by the column decode circuit 324 which communicates with I/O buffers 330. The output of the column decode circuit 324 selects the desired column data from the sense amplifier 322 outputs and is connected to the data buffer 326 for transfer from the memory device 300 through the address/data bus 308. On a write access, the row decode circuit 320 selects the row page and the column decode circuit 324 selects the write sense amplifiers 322. Data values to be written are connected from the data buffer 326 to the write sense amplifiers 322 selected by the column decode circuit 324 and are then written to the selected floating gate memory cells of the memory array 312. The written memory cells are then reselected by the row and column decode circuits 320, 324 and sense amplifiers 322 so that they can be read to verify that the correct values have been programmed into the selected memory cells.

Figure 4:
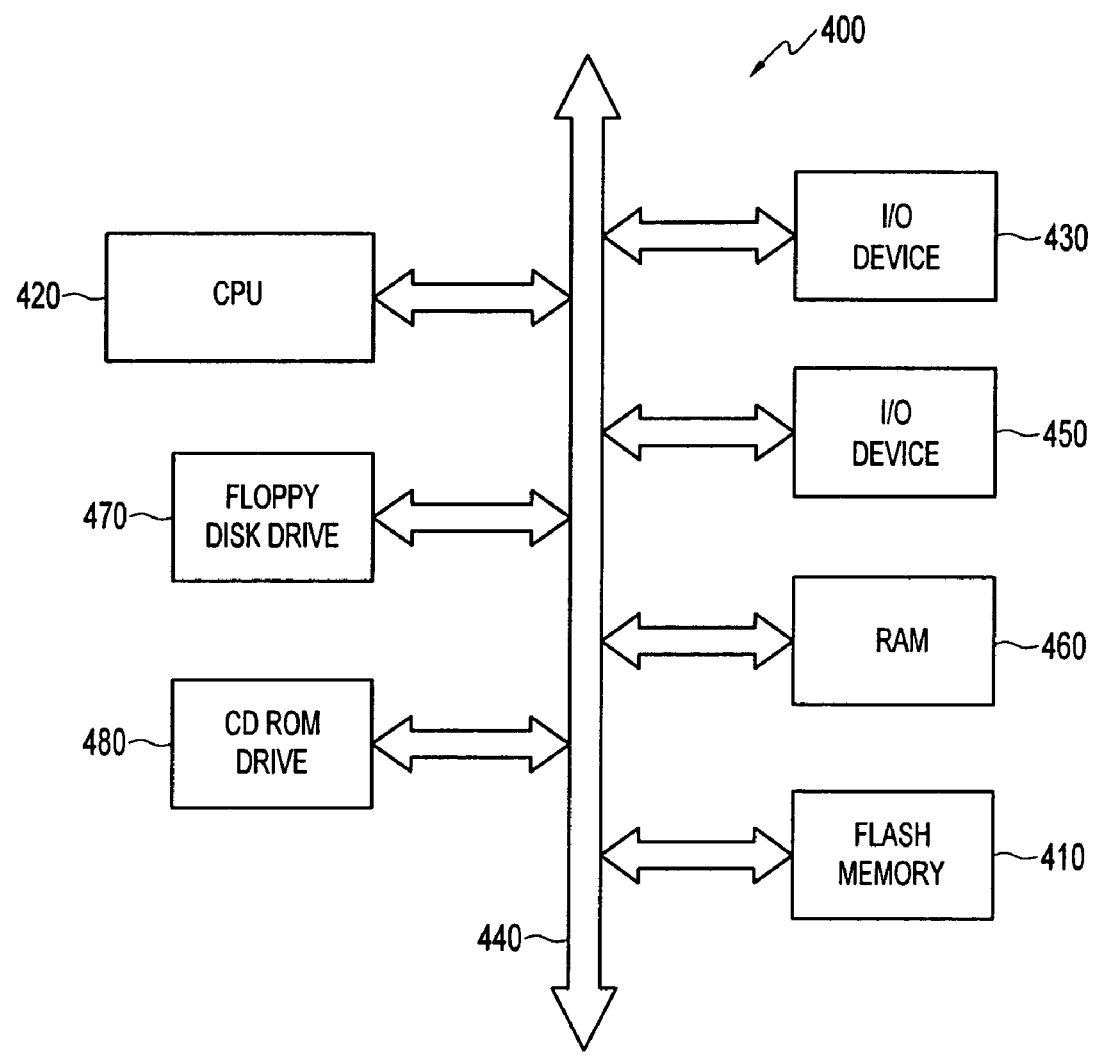
FIG. 4 illustrates a processor system incorporating a flash memory device constructed in accordance with an embodiment of the invention.

FIG. 4 is a block diagram of a processor system 400 utilizing a memory device, e.g., a flash memory device 410, that may incorporate a circuit in accordance with an embodiment of the invention. The flash memory device 410 shown in FIG. 4 corresponds to the flash memory device 300 shown in FIG. 3. The function of the host 302 in FIG. 3 may be fulfilled by the central processing unit (CPU) 420 of FIG. 4, or alternatively, the host 302 may be included with the flash memory 410. The processor system 400 may be a computer system, a process control system or any other system employing a processor and associated memory. The system 400 includes a CPU 420, e.g., a microprocessor, that communicates with the flash memory 410 and an I/O device 430 over a bus 440. It must be noted that the bus 440 may be a series of buses and bridges commonly used in a processor system, but for convenience purposes only, the bus 440 has been illustrated as a single bus. A second I/O device 450 is illustrated, but is not necessary to practice the invention. The processor system 400 also includes random access memory (RAM) device 460 and may include a read-only memory (ROM) device (not shown), and peripheral devices such as a floppy disk drive 470 and a compact disk (CD) ROM drive 480 that also communicate with the CPU 420 over the bus 440 as is well known in the art.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, while the invention is described in connection with a flash memory and a NAND flash memory, it can be practiced with any other type of circuit, including integrated circuits that include a capacitance that may be charged. Accordingly, the invention is not limited by the foregoing description or drawings, but is only limited by the scope of the appended claims.

What is claimed as new and desired to be protected by Letters Patent of the United States is:

1. A method of charging a capacitance of a circuit comprising the acts of:
   comparing a reference voltage to a voltage representing the voltage of the capacitance;
   using an operating voltage derived from an external voltage to charge the capacitance when the voltage representing the voltage of the capacitance is higher than the reference voltage; and
   using said external voltage to charge the capacitance when the voltage representing the voltage of the capacitance is lower than the reference voltage.

2. The method of claim 1, wherein the reference voltage is equal to the operating voltage.

3. The method of claim 1, wherein the reference voltage is set to a value which causes the operating voltage to charge the capacitance when the voltage of the capacitance is above a predetermined voltage that is less than the operating voltage.

4. The method of claim 1, further comprising the act of supplying the operating voltage to operating portions of said circuit.

5. The method of claim 1, wherein said circuit is an integrated circuit.

6. The method of claim 1, wherein said circuit is a flash memory integrated circuit.

7. The method of claim 1, wherein the voltage representing the voltage of the capacitance is taken from a voltage divider coupled to said capacitance.

8. The method of claim 7, wherein the reference voltage is set to a value which causes the external voltage to charge the capacitance when the voltage of the capacitance is below a predetermined voltage that is less than the operating voltage.

9. The method of claim 1, wherein said operating voltage is a regulated voltage derived from said external voltage.

10. A circuit for charging a circuit capacitance comprising:
    a comparator for comparing a reference voltage and a voltage representing a voltage on said capacitance and producing a signal based on the comparison;
    a first circuit for controlling a current used to charge the capacitance; and
    a switching circuit for routing either an external voltage or an operating voltage derived from said external voltage to the first circuit based on the signal from the comparator.

11. The circuit of claim 10, wherein the first circuit is a current mirror.

12. The circuit of claim 10, wherein the switching circuit is a multiplexer.

13. The circuit of claim 10, further comprising:
    a voltage divider for dividing the voltage on said capacitance to produce said voltage representing a voltage on said capacitance.

14. The circuit of claim 10, wherein the switching circuit has one input connected to an external power supply and another input connected to an operating voltage regulator.

15. The circuit of claim 14, wherein the operating voltage regulator is connected to portions of said circuit for supplying the operating voltage to said circuit portions.

16. The circuit of claim 10, wherein said capacitance is a capacitance of an integrated circuit device.

17. The circuit of claim 16, wherein the capacitance is a capacitance of a flash memory device.

18. A memory device comprising:
    a memory storage area and associated circuits for operating the memory storage area;
    a voltage regulator for supplying an operating voltage derived from an external voltage to said memory storage area and associated circuits;
    a comparator for comparing a reference voltage and a voltage representing a voltage on a capacitance and producing a signal based on the comparison;
    a first circuit for controlling a current used to charge the capacitance; and
    a switching circuit for routing either said external voltage or said operating voltage to the first circuit based on the signal from the comparator.

19. The memory device of claim 17, wherein the first circuit is a current mirror.

20. The memory device of claim 17, wherein the switching circuit is a multiplexer.

21. The memory device of claim 17, further comprising:
    a voltage divider for dividing the voltage on said capacitance to produce said voltage representing a voltage on said capacitance.

22. The memory device of claim 17, wherein the switching circuit has one input connected to an external power supply and another input connected to an operating voltage regulator.

23. A flash memory integrated circuit comprising:
    a memory storage comprising at least one array of flash memory cells;
    a voltage regulator for receiving an external voltage and supplying a regulated voltage to said array and associated circuitry;
    a switch having one input for receiving said external voltage, another input for receiving the output of said voltage regulator, and an output which is one of said external voltage and regulated voltage selected in accordance with a state of a control signal;
    a capacitance charging circuit for charging a capacitance of said flash memory integrated circuit; and
    a comparator for receiving a reference voltage and a voltage representing the voltage on said capacitance and supplying a control signal to said switch.

24. The flash memory integrated circuit of claim 23, wherein the capacitance charging circuit is a current mirror.

25. The memory device of claim 23, wherein the switch is a multiplexer.

26. The memory device of claim 23, further comprising:
    a voltage divider for dividing the voltage on said capacitance to produce said voltage representing the voltage on said capacitance.

* * * * *